(12) United States Patent
Davis et al.

(10) Patent No.: US 8,972,649 B2
(45) Date of Patent: Mar. 3, 2015

(54) WRITING MEMORY BLOCKS USING CODEWORDS

(71) Applicant: Microsoft Corporation, Redmond, WA (US)

(72) Inventors: John D. Davis, San Francisco, CA (US); Parikshit Gopalan, Sunnyvale, CA (US); Mark S. Manasse, San Francisco, CA (US); Karin Strauss, Seattle, WA (US); Sergey Yekhanin, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 186 days.

(21) Appl. No.: 13/645,515

(22) Filed: Oct. 5, 2012

(65) Prior Publication Data

US 2014/0101366 A1 Apr. 10, 2014

(51) Int. Cl.
*G06F 12/00* (2006.01)
*G06F 12/02* (2006.01)
*G06F 12/08* (2006.01)

(52) U.S. Cl.
CPC ........ *G06F 12/0207* (2013.01); *G06F 12/0813* (2013.01)
USPC ...................................................... 711/102

(58) Field of Classification Search
CPC . G06F 17/16; G06F 12/0207; G06F 12/0813; G11C 29/808; G11C 29/70
USPC ....................... 711/102; 714/723; 375/240.24
See application file for complete search history.

(56) References Cited

U.S. PATENT DOCUMENTS

| | | | |
|---|---|---|---|
| 8,176,235 B2 | 5/2012 | Franceschini et al. | |
| 8,201,024 B2 | 6/2012 | Burger et al. | |
| 8,595,573 B2 * | 11/2013 | Shalvi et al. | 714/718 |
| 2001/0048625 A1 * | 12/2001 | Patti et al. | 365/201 |
| 2001/0055233 A1 * | 12/2001 | Nagai | 365/225.7 |
| 2002/0066057 A1 * | 5/2002 | Daehn | 714/723 |
| 2004/0210814 A1 * | 10/2004 | Cargnoni et al. | 714/758 |
| 2004/0221192 A1 * | 11/2004 | Motta et al. | 714/8 |
| 2004/0257901 A1 * | 12/2004 | Nadeau-Dostie et al. | 365/232 |
| 2007/0103978 A1 * | 5/2007 | Conley et al. | 365/185.09 |

(Continued)

OTHER PUBLICATIONS

IBM, Determining Bounded Codeword Lengths Using Limited Program Memory, Nov. 1, 1977, IP.com.*

(Continued)

*Primary Examiner* — Charles Rones
*Assistant Examiner* — Khoa Doan
(74) *Attorney, Agent, or Firm* — Gregg Wisdom; Judy Yee; Micky Minhas (57) ABSTRACT

A generator matrix is provided to generate codewords from messages of write operations. Rather than generate a codeword using the entire generator matrix, some number of bits of the codeword are determined to be, or designated as, stuck bits. One or more submatrices of the generator matrix are determined based on the columns of the generator matrix that correspond to the stuck bits. The submatrices are used to generate the codeword from the message, and only the bits of the codeword that are not the stuck bits are written to a memory block. By designating one or more bits as stuck bits, the operating life of the bits is increased. Some of the submatrices of the generator matrix may be pre-computed for different stuck bit combinations. The pre-computed submatrices may be used to generate the codewords, thereby increasing the performance of write operations.

20 Claims, 6 Drawing Sheets

(56) References Cited

U.S. PATENT DOCUMENTS

| | | | |
|---|---|---|---|
| 2010/0218070 A1 | 8/2010 | Franceschini et al. | |
| 2011/0119538 A1 | 5/2011 | Ipek et al. | |
| 2011/0185260 A1* | 7/2011 | Mudge et al. | 714/763 |
| 2011/0296258 A1 | 12/2011 | Schechter et al. | |
| 2012/0008390 A1* | 1/2012 | Seong | 365/185.03 |
| 2012/0124442 A1 | 5/2012 | Strauss | |
| 2012/0297245 A1* | 11/2012 | Li et al. | 714/15 |
| 2013/0151921 A1* | 6/2013 | Uchikawa et al. | 714/752 |
| 2013/0290703 A1* | 10/2013 | Resch et al. | 713/155 |

OTHER PUBLICATIONS

Jari Nikara, Stamatis Vassiliadis, Multiple-symbol Parallel Decoding for Variable Length Codes, Apr. 2004, vol. 12, No. 4. IEEE.*

Qureshi, Moinuddin K., "Pay-As-You-Go: Low-Overhead Hard-Error Correction for Phase Change Memories", Retrieved at <<http://users.ece.gatech.edu/~moin/papers/micro11.pdf>>, In Proceedings of the 44th Annual IEEE/ACM International Symposium on Microarchitecture, Dec. 6, 2011, pp. 11.

Chen, et al., "RePRAM: Re-cycling PRAM Faulty Blocks for Extended Lifetime", Retrieved at <<http://www.seas.gwu.edu/~guruv/dsn12.pdf>>, In Proceedings of the 42nd Annual IEEE/IFIP International Conference on Dependable Systems and Networks, Jun. 28, 2012, pp. 12.

Xu, Wei, "A Time-Aware Fault Tolerance Scheme to Improve Reliability of Multilevel Phase-Change Memory in the Presence of Significant Resistance Drift", Retrieved at <<http://ieeexplore.ieee.org/stamp/stamp.jsp?tp=&arnumber=5497218>>, IEEE Transactions on Very Large Scale Integration (VLSI) Systems, vol. 19, No. 8, Aug. 2011, pp. 11.

Seong, et al., "SAFER: Stuck-At-Fault Error Recovery for Memories", Retrieved at <<http://ieeexplore.ieee.org/stamp/stamp.jsp?tp=&arnumber=5695530>>, In Proceedings of the 43rd Annual IEEE/ACM International Symposium on Microarchitecture, Dec. 4, 2010, pp. 10.

Ferreira, et al., "Using PCM in Next-generation Embedded Space Applications", Retrieved at <<http://ieeexplore.ieee.org/stamp/stamp.jsp?tp=&arnumber=5465975>>, In Proceedings of the 16th IEEE Real-Time and Embedded Technology and Applications Symposium, Apr. 12, 2010, pp. 10.

Torgersen, Mads, "Enhancing Phase Change Memory Lifetime through Fine-Grained Current Regulation and Voltage Upscaling", Retrieved at <<http://oldwww.cs.pitt.edu/~zhangyt/research/islped11.pdf>>, In Proceedings of the 17th IEEE/ACM International Symposium on Low-Power Electronics and Design, Aug. 1, 2011, pp. 6.

Ahn, et al., "Highly Manufacturable High Density Phase Change Memory of 64Mb and Beyond", Retrieved at <<http://ieeexplore.ieee.org/stamp/stamp.jsp?tp=&arnumber=1419329>>, In IEEE International Electron Devices Meeting, Technical Digest, Dec. 13, 2004, pp. 4.

Atwood, Greg, "The Evolution of Phase Change Memory", Retrieved at <<http://edm.micron.com/~/media/Documents/Products/White%20Paper/5539evolution_of_phase_change_memory.pdf>>, Micron Technology, Inc., Jul. 26, 2010, pp. 5.

Cho, et al., "Flip-N-Write: A Simple Deterministic Technique to Improve PRAM Write Performance, Energy and Endurance", Retrieved at <<http://ieeexplore.ieee.org/stamp/stamp.jsp?tp=&arnumber=5375405>>, In 42nd Annual IEEE/ACM International Symposium on Microarchitecture, Dec. 12, 2009, pp. 11.

Datta, et al., "Designing a Fast and Adaptive Error Correction Scheme for Increasing the Lifetime of Phase Change Memories", Retrieved at <<http://users.ece.utexas.edu/~touba/research/vts11.pdf>>, In IEEE 29th VLSI Test Symposium, May 1, 2011, pp. 6.

Henning, John L., "SPEC CPU2006 Benchmark Descriptions", Retrieved at <<http://www.spec.org/cpu2006/publications/CPU2006benchmarks.pdf>>, ACM SIGARCH Computer Architecture News, vol. 34, Issue 4, Sep. 2006, pp. 17.

Burr, et al., "Phase Change Memory Technology", Retrieved at <<http://arxiv.org/pdf/1001.1164.pdf>>, In Journal of Vacuum Science & Technology B, vol. 28, Issue 2, Mar. 29, 2010, pp. 49.

Hwang, et al., "Full Integration and Reliability Evaluation of Phase-change RAM Based on 024 Lm-CMOS Technologies", Retrieved at <<http://ieeexplore.ieee.org/stamp/stamp.jsp?tp=&arnumber=1221141&userType=inst>>, In Symposium on VLSI Technology Digest of Technical Papers, Jun. 10, 2003, pp. 2.

Ipek, et al., "Dynamically Replicated Memory: Building Reliable Systems from Nanoscale Resistive Memories", Retrieved at <<http://research.microsoft.com/pubs/115748/asplos10.pdf>>, In Proceedings of the Fifteenth Edition of Architectural Support for Programming Languages and Operating Systems, Mar. 13, 2010, pp. 12.

"Emerging Research Devices", Retrieved at <<http://www.itrs.net/Links/2009ITRS/2009Chapters_2009Tables/2009_ERD.pdf>>, The International Technology Roadmap for Semiconductors, Jul. 3, 2012, pp. 61.

Lee, et al., "Architecting Phase Change Memory as a Scalable DRAM Alternative", Retrieved at <<http://research.microsoft.com/en-us/people/ipek/isca09.pdf>>, In Proceedings of the 36th Annual International Symposium on Computer Architecture, Jun. 20, 2009, pp. 12.

Luk, et al., "Pin: Building Customized Program Analysis Tools with Dynamic Instrumentation", Retrieved at <<http://citeseerx.ist.psu.edu/viewdoc/download?doi=10.1.1.85.4883&rep=rep1&type=pdf>>, In Proceedings of the 2005 ACM SIGPLAN Conference on Programming Language Design and Implementation, Jun. 12, 2005, pp. 11.

Qureshi, et al., "Enhancing Lifetime and Security of PCM-Based Main Memory with Start-Gap Wear Leveling", Retrieved at <<http://citeseerx.ist.psu.edu/viewdoc/download?doi=10.1.1.153.7213&rep=rep1&type=pdf>>, In 42nd Annual IEEE/ACM International Symposium on Microarchitecture, Dec. 12, 2009, pp. 10.

Qureshi, et al., "Scalable High Performance Main Memory System Using Phase-Change Memory Technology", Retrieved at <<http://www.cs.ucsb.edu/~chong/290N-W10/pcm.pdf>>, In Proceedings of the 36th Annual International Symposium on Computer Architecture, Jun. 20, 2009, pp. 10.

Qureshi, et al., "Morphable Memory System: A Robust Architecture for Exploiting Multi-Level Phase Change Memories", Retrieved at <<http://researcher.watson.ibm.com/researcher/files/us-moinqureshi/papers-mms.pdf>>, In Proceedings of the 37th Annual International Symposium on Computer Architecture, Jun. 19, 2010, pp. 10.

Ralph, et al., "Spin Transfer Torques•", Retrieved at <<http://www.sciencedirect.com/science/article/pii/S0304885307010116>>, In Journal of Magnetism and Magnetic Materials, vol. 320, Issue 7, Apr. 2008, pp. 5.

Raoux, et al., "Phase-change Random Access Memory: A Scalable Technology", Retrieved at <<http://ieeexplore.ieee.org/stamp/stamp.jsp?tp=&arnumber=5388621>>, In Journal of IBM Research and Development, vol., Jul. 2008, pp. 15.

Schechter, et al., "Use ECP, not ECC, for Hard Failures in Resistive Memories", Retrieved at <<http://research.microsoft.com/pubs/131678/isca-ecp-final.pdf>>, In Proceedings of the 37th Annual International Symposium on Computer Architecture, Jun. 19, 2010, pp. 12.

Seong, et al., "Security Refresh: Prevent Malicious Wear-out and Increase Durability for Phase-Change Memory with Dynamically Randomized Address Mapping", Retrieved at <<http://www.irisa.fr/alf/downloads/PMA/3.pdf>>, In Proceedings of the 37th Annual International Symposium on Computer Architecture, vol. 38 Issue 3, Jun. 19, 2010, pp. 12.

Strukov, et al., "The Missing Memristor Found", Retrieved at <<http://inst.cs.berkeley.edu/~ee129/sp09/handouts/TheMissingMemristorFound.pdf>>, In Nature, vol. 453, May 1, 2008, pp. 4.

Yang, et al., "A Low Power Phase-Change Random Access Memory using a Data-Comparison Write Scheme", Retrieved at <<http://ieeexplore.ieee.org/stamp/stamp.jsp?arnumber=04253313>>, In IEEE International Symposium on Circuits and Systems, May 27, 2007, pp. 4.

(56) References Cited

OTHER PUBLICATIONS

Yoon, et al., "Free-p: Protecting Non-volatile Memory against Both hard and Soft Failures", Retrieved at <<http://ieeexplore.ieee.org/stamp/stamp.jsp?tp=&arnumber=5749752>>, In Proceedings of the 17th Symposium on High Performance Computer Architecture, Feb. 12, 2011, pp. 12.

Zhang, et al., "Characterizing and Mitigating the Impact of Process Variations on Phase Change based Memory Systems", Retrieved at <<http://www.ideal.ece.ufl.edu/publications/files/323-MICRO-09.pdf>>, In Proceedings of the 42nd Annual IEEE/ACM International Symposium on Microarchitecture, Dec. 12, 2009, pp. 12.

Zhang, et al., "Exploring Phase Change Memory and 3D Die-Stacking for Power/Thermal Friendly, Fast and Durable Memory Architectures", Retrieved at <<http://survey-p-c-m.googlecode.com/svn-history/r3/trunk/Papers/selected/tmp/324-PACT-09.pdf>>, In Proceedings of the 18th International Conference on Parallel Architectures and Compilation Techniques, Sep. 12, 2009, pp. 12.

Zhou, et al., "A Durable and Energy Efficient Main Memory Using Phase Change Memory Technology", Retrieved at <<http://www.cs.pitt.edu/~zhangyt/research/isca09.pdf>>, In Proceedings of the 36th Annual International Symposium on Computer Architecture, Jun. 20, 2009, pp. 10.

"Remapping Inoperable Memory Blocks Using Pointers", U.S. Appl. No. 13/218,480, filed Aug. 26, 2011, pp. 27.

Tsybakov, B.S., "Additive Group Codes for Defect Correction", Probl. Peredachi Inf., 11:1 (1975), pp. 111-113.

Tsybakov, B.S., "Additive Group Codes for Defect Correction", Problems of Information Transmission, 1975, 11:1, pp. 88-90.

Kuznetsov, A.V., et al., "Coding in a Memory with Defective Cells", Probl. Peredachi Inf., 10:2 (1974), pp. 52-60.

Kuznetsov, A.V., et al., "Coding in a Memory with Defective Cells", Problems of Information Transmission, 1974, 10:2, 132-138.

\* cited by examiner

WRITING MEMORY BLOCKS USING CODEWORDS

BACKGROUND

Silicon process technology continues to shrink the feature size of devices causing more process variation. As a result, charged based memory storage technologies, such as dynamic random access memory (DRAM), may no longer scale with successive technology generations.

Phase change memory (PCM) is a potential replacement for DRAM in computers and other digital devices. Like other non-volatile memories, PCM has a limited lifetime or durability. Typically, over time, one or more cells of the blocks of a PCM device may become inoperable and can no longer be reliably written to. Other types of memory may have similar issues.

SUMMARY

A code, such as a generator matrix, is provided to generate codewords from messages of write operations. Rather than generate a codeword using the entire generator matrix, some number of bits of the codeword are determined to be, or designated as, stuck bits. One or more submatrices of the generator matrix are determined based on the columns of the generator matrix that correspond to the stuck bits. The submatrices are used to generate the codeword from the message, and only some of the bits of the codeword that are not the stuck bits are written to a memory block. By designating one or more still writable bits as stuck bits, the operating life of those bits is increased. Some of the submatrices of the generator matrix may be pre-computed for different stuck bit combinations and stored in a read-only memory (ROM) or other memory structure. The pre-computed submatrices may be used to generate the codewords, thereby increasing the performance of write operations.

The naïve way to use such codes to deal with stuck bits is to write the encoding of a message x using the code, which may allow for the correction of up to $(d-1)/2$ stuck bits. In contrast, the methods and systems disclosed herein uses an $[n,k,d]$ linear code, and knowledge of the stuck bit locations, which allow for the correction of $d-1$ stuck bits. Information about the stuck bit locations is not used for a successful read; moreover it may not be revealed by, or during, a successful read operation. The read operation may reveal what the encoded message was, but not the stuck bit locations.

In an implementation, a write operation is received by a memory controller. The write operation includes an identifier of a memory block in a memory device and a message. The memory block includes bits, and each bit has an associated index value. One or more bits of the memory block that are stuck bits are determined by the memory controller. A generator matrix associated with the memory device is retrieved by the memory controller. The generator matrix includes columns, and each column has an associated index value. A set of index values is selected from the generator matrix based on the index values associated with the stuck bit(s) by the memory controller. A codeword is determined from the message based on the selected set of index values from the generator matrix by the memory controller. The determined codeword is stored at the memory block by the memory controller.

In an implementation, a write operation is received by the memory controller. The write operation is associated with a message and a memory block. The memory block includes bits, and each bit has an index value. Identifiers of one or more stuck bits of the memory block are received by the memory controller. A set of index values are selected from a generator matrix associated with the memory controller based on the index values associated with the one or more stuck bits. A matrix is retrieved using the selected set of index values. The retrieved matrix is an inverse of a submatrix of the generator matrix restricted by the index values in the set of index values. A codeword is determined from the message based on the retrieved matrix by the memory controller. The determined codeword is stored in the memory block by the memory controller.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

Figure 1:
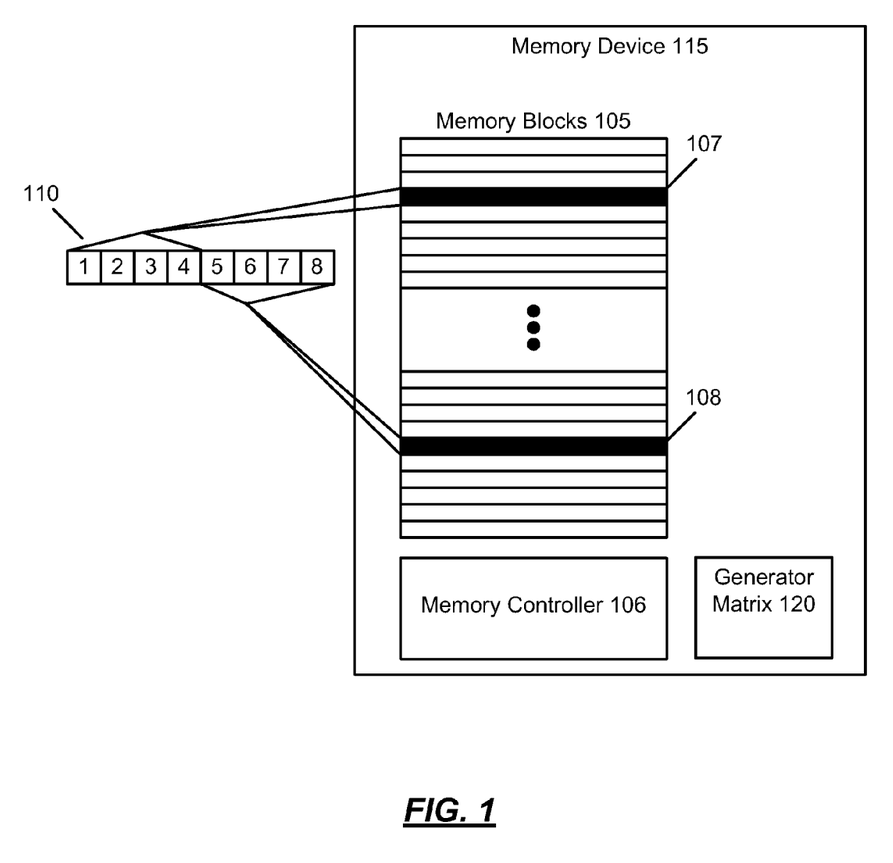
FIG. 1 is an illustration of an example memory device.

FIG. 1 is an illustration of an example memory device 115. One or more applications of an operating system may perform one or more memory operations with respect to the memory device 115. The operations may include read and write operations. In some implementations, the memory device 115 may be a phase change memory ("PCM") device; however, other types of memory devices may be supported. An example of the memory device 115 may be comprised within a computing system or comprise a computing system, such as the computing system 600 described with respect to FIG. 6.

The memory device 115 may include a memory controller 106. The memory controller 106 may receive memory operations for one or more memory blocks 105. The memory controller 106 may then fulfill the memory operations using the one or more memory blocks 105. A memory block 105 may include multiple bits. For example, depending on the implementations, a memory block 105 may include 4, 8, 16, 32, 64, 128 or more bytes. The blocks may be further divided into chunks or words for encoding.

In some implementations, the memory controller 106 may receive write operations that include a message. A message, as used herein, refers to the data that a user or process associated with the write operation wants to write to the memory blocks 105.

As described above, memory blocks 105, particularly PCM memory blocks, may suffer from one or more stuck bits. As used herein, a bit is stuck if it no longer can be written to or has otherwise failed. To provide protection against data loss due to stuck bits, the memory controller 106 may generate a codeword using a code and the provided message. The codeword may include redundant bits which may allow the message to be recovered from a stored codeword even where some number of the bits in the memory block 105 are, or have become, stuck.

A variety of different types of codes may be used by the memory controller 106 to generate the codewords. A code may be described using the tuple [n, k, d] where n is the size of the codeword, k is the size of the message that is encoded, and d−1 is the number of errors (i.e., stuck bits) that the codeword can tolerate. In an example herein, an [8, 4, 4] code is described. Other types of codes may be used.

The original memory blocks 105 may be divided into many smaller messages by the memory controller 106 to improve the encode (write) and decode (read) performance. This may provide flexibility in selecting the type of code and the amount of additional bits used to store the collection of codewords. For example, where the memory blocks 105 are divided into ¼ size and ½ size memory blocks 105, [25, 20, 3] codes and [15, 10, 4] codes may be used by the memory controller 106.

In some implementations, the codeword generated from a message may be stored in two portions and each portion includes some of the bits of the codeword. A first portion of the codeword is stored in what is referred to as a primary block, and the second portion is stored in what is referred to as a spare block. A primary block may be a block from the memory blocks 105 that is addressable by the operating system. A spare block is a block from the memory blocks 105 that is not addressable by the operating system either because of errors or because the block was reserved as part of a spare block pool, for example. Instead of leaving these blocks unused, the spare blocks are paired with primary blocks to store the additional redundant bits associated with the codewords. The term memory block as used herein may refer to a primary block and its paired spare block. The bits of the memory block that correspond to the primary block are the primary bits, and the bits of the memory block that correspond to the spare block are the spare bits.

For example, a sample memory block 110 may be made up of a primary memory block 107 and a spare memory block 108. As illustrated in FIG. 1, each bit of the memory block 110 may be associated with an index value. The bits corresponding to the index values 1-4 may correspond to bits of the primary memory block 107 and the bits corresponding to the index values 5-8 may correspond to the spare memory block 108.

In some implementations, the memory controller 106 may generate a codeword from a message, e.g., by multiplying the message by a code based on the generator matrix 120. The size of the generator matrix 120 may be related to the size of the codeword and the size of the message. Thus, for a message of size k and a codeword of size n, an n×k generator matrix 120 may be used. For example a sample 8×4 generator matrix 120 is:

$$\begin{matrix} 1 & 1 & 1 & 1 & 1 & 1 & 1 & 1 \\ 0 & 0 & 0 & 0 & 1 & 1 & 1 & 1 \\ 0 & 0 & 1 & 1 & 0 & 0 & 1 & 1 \\ 0 & 1 & 0 & 1 & 0 & 1 & 0 & 1. \end{matrix}$$

Like the memory block 110, the generator matrix 120 may have index values. The index value 1 may correspond to the first column of the generator matrix 120 and the index value 8 may correspond to the last column of the generator matrix 120.

In some implementations, the memory controller 106 may receive a write operation that identifies a memory block 105 and includes a message to write to the identified memory block. In response to the write operation, the memory controller 106 may generate a codeword from the message based on the generator matrix 120. The generated codeword may be stored in the identified memory block.

Conversely, when the memory controller 106 receives a read operation that identifies a memory block 105, the memory controller 106 may retrieve the codeword from the memory block 105 and may multiply the transpose of the codeword by the generator matrix 120 to recover the original message. The message may be returned in response to the received read operation.

Figure 2:
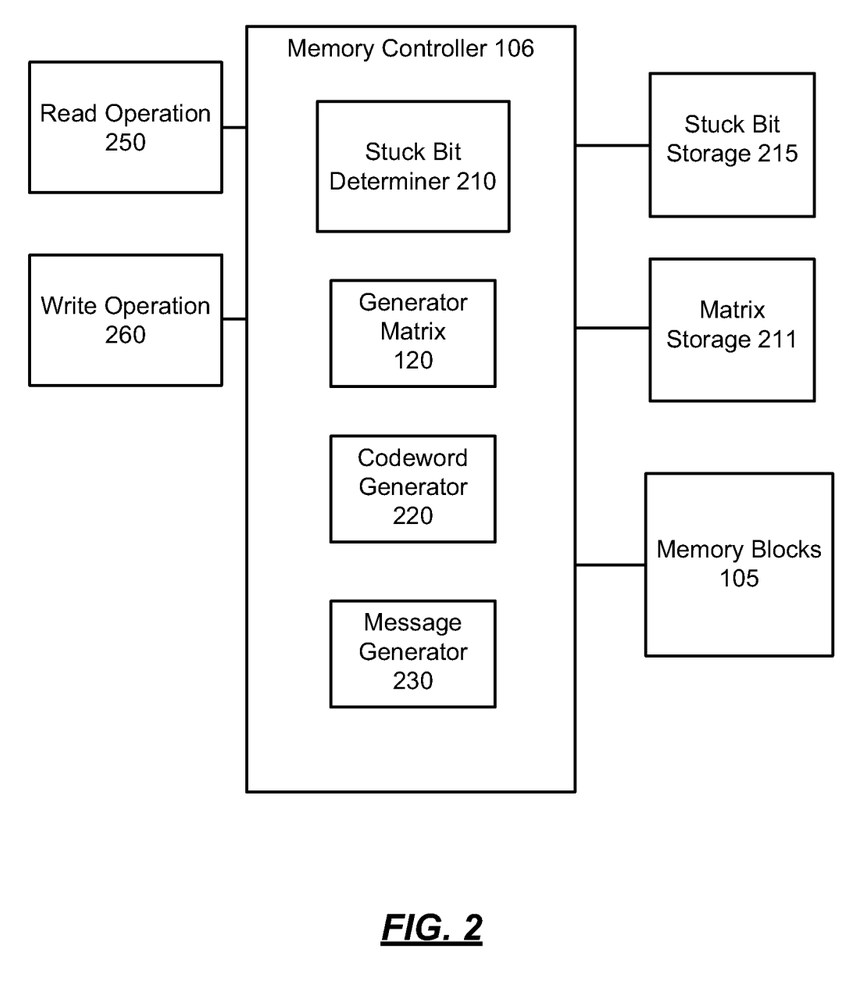
FIG. 2 is an illustration of an example memory controller.

As described further with respect to FIG. 2, for a write operation, where the memory controller 106 can determine the locations of one or more stuck bits in a memory block, the memory controller 106 may determine the codeword in such a way that may extend the life of the bits in the memory block 105. For example, the memory controller 106 may select columns of the generator matrix 120 that do not correspond to the stuck bits, and may determine the codeword to write to the memory block using the inverse of a submatrix formed by the selected columns. Only the non-stuck bits of the memory block 105 may be written using the determined codeword.

Where the determined number of stuck bits in a memory block 105 is less than the allowed number of stuck bits, the memory controller 106 may select non-stuck bits to take the place of the stuck bits for purposes of codeword determination. Because these selected bits are written by the determined codeword and the stuck bits are not written, the life of the memory block is increased. In some of the codes ([25, 20, 3], and [15, 10, 4] codes in particular) there may be at least 2 or 3 bits that are not known to be stuck that will nonetheless remain unchanged in the encoding process.

FIG. 2 is an illustration of an example memory controller 106. The memory controller 106 may include one or more components including, but not limited to, a stuck bit determiner 210, the generator matrix 120, a codeword generator 220, and a message generator 230. More or fewer components may be supported.

The stuck bit determiner 210 may determine zero or more stuck bits for the memory controller 106. In some implementations, the stuck bit determiner 210 may determine zero or more stuck bits in a memory block 105 in response to a write operation 260. For example, the stuck bit determiner 210 may determine if there are any stuck bits in a memory block 105 before writing any data associated with the write operation 260. In other implementations, the stuck bit determiner 210 may determine stuck bits in all of the memory blocks 105 at once, or in batches. For example, during periods of inactivity the memory controller 106 may determine stuck bits in the memory blocks 105.

In some implementations, the stuck bit determiner 210 may determine stuck bits in a memory block 105 by performing an XOR operation of the data stored in the memory block with the inverse of the data stored in the memory block. Indicators of any determined stuck bits may be stored by the stuck bit determiner in a stuck bit storage 215. Any type of data structure may be used for the stuck bit storage 215.

In some implementations, the stuck bit determiner 210 may determine stuck bits in a memory block 105 by indexing into a stuck bit storage cache using the memory block address to find the error location vector. If the error location vector is found, the error location vector can be used as the indicator of any stuck bits. After the write operation, any new error locations can be updated in stuck bit storage as a result of the normal read-write-verify process. This may prevent additional memory block wear due to stuck bit location finding, thereby increasing memory block lifetime. If the stuck bit storage cache does not contain the error location vector, the implementation above, for example, may be used to determine this vector.

The codeword generator 220 may receive a write operation 260 that includes an identifier of a memory block 105 and a message. The codeword generator 220 may select one or more index values of the generator matrix 120 to generate a codeword based on the received message. The codeword generator 220 may determine the one or more stuck bits of the identified memory block 105 (from the stuck bit storage 215) and may select one or more index values of the generator matrix 120 (i.e., columns) to use to generate the codeword to write to the memory block 105. In some implementations, the codeword generator 220 may select k index values regardless of the number of stuck bits. The set of index values for a memory block 105 is referred to herein as J.

In some implementations, the codeword generator 220 may select the index values for J by selecting any four index values of the generator matrix 120 that do not correspond to index values of the memory block 105 that are stuck bits (and whose corresponding determinant is non-zero). The columns of the generator matrix 120 that correspond to the selected index values may be used to generate a 4 by 4 submatrix of the generator matrix 120. The codeword generator 220 may select the index values such that the determinant of the resulting 4×4 matrix is non-zero.

Where there is a choice regarding what index values are selected, the codeword generator 220 may select the set of index values that maximizes the number of index values in J that are within the spare memory block portion of the memory block 105. By selecting index values that correspond to the spare memory block, the number of writes of the bits of the primary memory blocks is reduced and the overall life of the primary memory blocks is increased.

For example, consider the generator matrix G:

$$\begin{matrix} 1 & 1 & 1 & 1 & 1 & 1 & 1 & 1 \\ 0 & 0 & 0 & 0 & 1 & 1 & 1 & 1 \\ 0 & 0 & 1 & 1 & 0 & 0 & 1 & 1 \\ 0 & 1 & 0 & 1 & 0 & 1 & 0 & 1 \end{matrix}$$

As determined by the stuck bit determiner 210, the memory block 105 may have stuck bits corresponding to the index values of 1, 4, and 5. Thus, the codeword generator may not choose the index values 1, 4, and 5, but is free to choose from any for the remaining index values of 2, 3, 6, 7, and 8. Given those available index values, the codeword generator 220 may choose from the following sets of index values for J:

J=[2,3,6,7]
J=[2,3,6,8]
J=[2,3,7,8]
J=[3,6,7,8]
J=[2,6,7,8].

The submatrix generated from the columns of the set [2,3, 6,7], has a determinant of zero, and therefore is not a suitable set of index values. The sets [2,3,6,8] and [2,3,7,8] are acceptable but have two index values (i.e., 2 and 3) that are in the primary memory block. The index values 1-4 correspond to the primary memory block and the index values 5-8 correspond to the spare memory block. The sets [3,6,7,8] and [2,6,7,8] both have only one index value that is in the primary memory block, and are therefore equally good candidates for J.

After selecting J, the codeword generator 220 may determine one or more submatrices of the generator matrix G based on J. The submatrices may include a submatrix of G that is restricted by the index values in J (i.e., $G|_J$) and a submatrix of G that is restricted by the index values that are not in J (i.e., $G|_{[n]\backslash J}$). Also, the inverse of $G|_J$ (i.e., M) is calculated. Any method for calculating the inverse of a matrix may be used.

Thus, continuing the example above, for J=[2,6,7,8]:

$$G|_J = \begin{matrix} 1 & 1 & 1 & 1 \\ 0 & 1 & 1 & 1 \\ 0 & 0 & 1 & 1 \\ 1 & 1 & 0 & 1 \end{matrix}$$

$$G|_{[n]\backslash J} = \begin{matrix} 1 & 1 & 1 & 1 \\ 0 & 0 & 0 & 1 \\ 0 & 1 & 1 & 0 \\ 0 & 0 & 1 & 0 \end{matrix}$$

$$M = \begin{matrix} 1 & 1 & 0 & 0 \\ 0 & 1 & 1 & 0 \\ 1 & 0 & 0 & 1 \\ 1 & 0 & 1 & 1 \end{matrix}$$

The codeword generator 220 may then determine a codeword y from the message x using the submatrices M and $G|_{[n]\backslash J}$. In some implementations, the codeword generator 220 may determine y using the equation (1) where T is the transpose of the corresponding vector:

$$Gy^T = x \quad (1)$$

The codeword y may have two components, a component u that includes values for the bits that correspond to the index values in J, and a component v that includes values for the bits that correspond to the index values that are outside of J (y=u+v). Substituting y for u+v into equation (1) gives equation (2):

$$Gv^T = x + Gu^T \quad (2)$$

Restricting the left side of equation (2) by $G|_J$ and the right side of equation (2) by $G|_{[n]\backslash J}$ gives equation (3):

$$G|_J v^T|_J = x + G|_{[n]\backslash J} u^T|_{[n]\backslash J} \quad (3)$$

Multiplying both sides of equation (3) by M gives equation (4):

$$v^T|_J = M(x + G|_{[n]\backslash J} u^T|_{[n]\backslash J}) \quad (4)$$

The codeword generator 220 may calculate the non-stuck bits (real or designated) of the codeword y (i.e., u+v) based on the received message x using the submatrices $G|_{[n]\backslash J}$ and M according to equation (4). The codeword generator 220 may write the bits corresponding to v in the memory block 105 associated with the write operation 260 as the codeword. Because the bits of the codeword y that correspond to u are stuck bits or have been designated as stuck bits, the codeword generator 220 may not write these bits of the codeword to the memory block 105.

In some implementations, the codeword generator 220 may calculate $G|_{[n]\setminus J}$ and M for each write operation 260 based on the set of index values J selected for the write operation. Alternatively, in some implementations, the codeword generator 220 may predetermine $G|_{[n]\setminus J}$ and M for some or all possible index value combinations for J. These predetermined submatrices may be stored by the codeword generator 220 in a matrix storage 211. The matrix storage 211 may be a ROM, cache or other memory structure. The predetermined submatrices may be stored in ROM in advance of a shipping data associated with the memory controller 106. The stored submatrices may be indexed by J in the matrix storage 211, and may be later retrieved by the codeword generator 220 based on set of index values selected by the codeword generator 220 for a write operation 260.

In some implementations, rather than index the stored submatrices in the matrix storage 211 by J, the stored submatrices may be indexed by the set of stuck bits determined for a memory block 105. As described above, the set of index values selected for J seeks to maximize the number of bits that are written to the spare memory blocks, as well as minimize the number of bits that are written to the memory block overall. Accordingly, for each set of stuck bits, there may be an optimal set of index values J. The codeword generator 220 may predetermine the submatrices $G|_{[n]\setminus J}$ and M for each optimal set of index values J for each possible set of stuck bits. Later, after determining the set of stuck bits for a write operation 250, the codeword generator 220 may retrieve the predetermined $G|_{[n]\setminus J}$ and M for the optimal J for the determined set of stuck bits from the matrix storage 211.

The message generator 230 may receive a read operation 250 from the operating system, and may provide a message corresponding to the read operation 250 from the memory blocks 105. The read operation 250 may include an identifier of a memory block. In response to the read operation 250, the message generator 230 may retrieve a codeword from the identified memory block. The message x may be determined from the storage codeword y by multiplying the generator matrix G by the transpose of the codeword y according to equation (1). The determined message may be provided to the operating system in response to the read operation 250.

Figure 3:
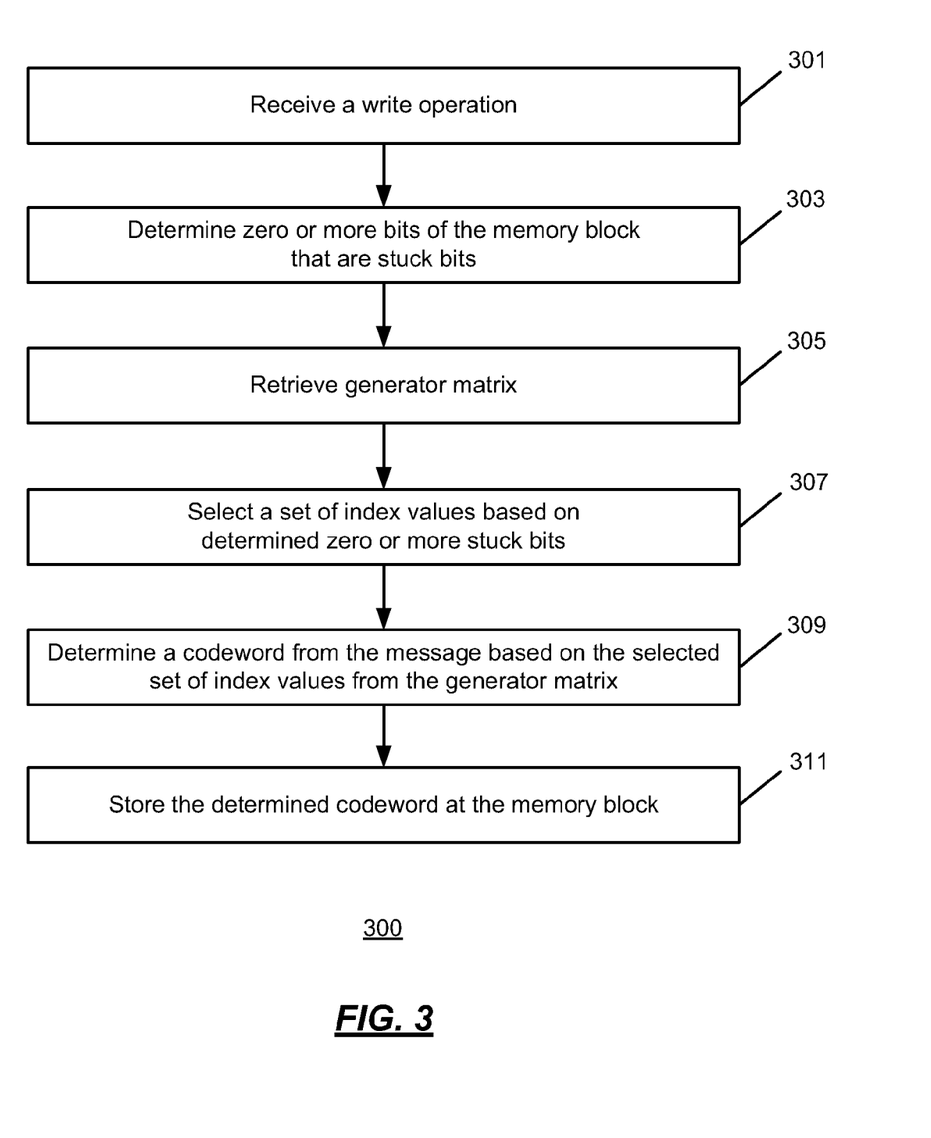
FIG. 3 is an operational flow of an implementation of a method for determining a codeword for a message associated with a write operation.

FIG. 3 is an operational flow of an implementation of a method 300 for determining a codeword for a message associated with a write operation. The method 300 may be implemented by the codeword generator 220 of the memory controller 106, for example.

A write operation is received at 301. The write operation 260 may be received by the memory controller 106 from an operating system. The write operation 260 may include a message and an identifier of a memory block 105, for example. The message may be a four bit message; however, other size messages may be supported. The memory block 105 may include eight bits and each bit may have an associated index value. The first four index values of the memory block 105 may be associated with a primary memory block and the last four index values of the memory block 105 may be associated with a spare memory block.

Zero or more stuck bits of the memory block are determined at 303. The one or more stuck bits may be determined by the stuck bit determiner 210 of the memory controller 106. In some implementations, the stuck bit determiner 210 may determine the zero or more stuck bits by referring to the stuck bit storage 215. Other methods or data structures may be used.

A generator matrix is retrieved at 305. The generator matrix 120 may be retrieved by the memory controller 106. The generator matrix 120 may be an 8×4 bit matrix. Each column of the generator matrix 120 may be associated with an index value of the memory block 105.

A set of index values is selected at 307. The set of index values may include four index values and may be selected based on the determined zero or more stuck bits. The selected index values may include index values of the memory block 105 that correspond to non-stuck bits. The designated index values in the set may be selected such that the number of index values that are associated with the spare memory block is maximized, for example. In addition, the index values may be further selected such that a submatrix of the generator matrix 120 constructed from the columns of the generator matrix 120 that correspond to the index values has a non-zero determinant. Where there are zero stuck bits, the memory controller 106 may select the index values for the set of index values by selecting the four index values from the spare memory block.

A codeword is determined from the message based on the selected set of index values from the generator matrix at 309. The codeword may be generated by the codeword generator 220. In some implementations, the codeword may be generated by determining a first submatrix of the generator matrix 120 restricted by the index values that are in the selected set of index values, and determining a second submatrix of the generator matrix 120 that is restricted by the index values that are not in the selected set of index values. The first submatrix may be inverse of the submatrix of the generator matrix 120 restricted by the set index values that are in the selected set of index values. Depending on the implementation, the codeword generator 220 may either calculate the first and second submatrices from the generator matrix 120, or may retrieve them from the matrix storage 211 based on the set of index values or the determined stuck bits. The codeword may be determined by the codeword generator 220 using the first and second submatrices.

The determined codeword is stored at the memory block at 311. The determined codeword may be stored by the codeword generator 220. The bits of the determined codeword are written to the bits of the memory block 105 corresponding to the index value of the selected set of index values. The bits of the memory block 105 with index values that are not in the selected set of index values are not written, thereby extending the life of any of the non-written bits.

Figure 4:
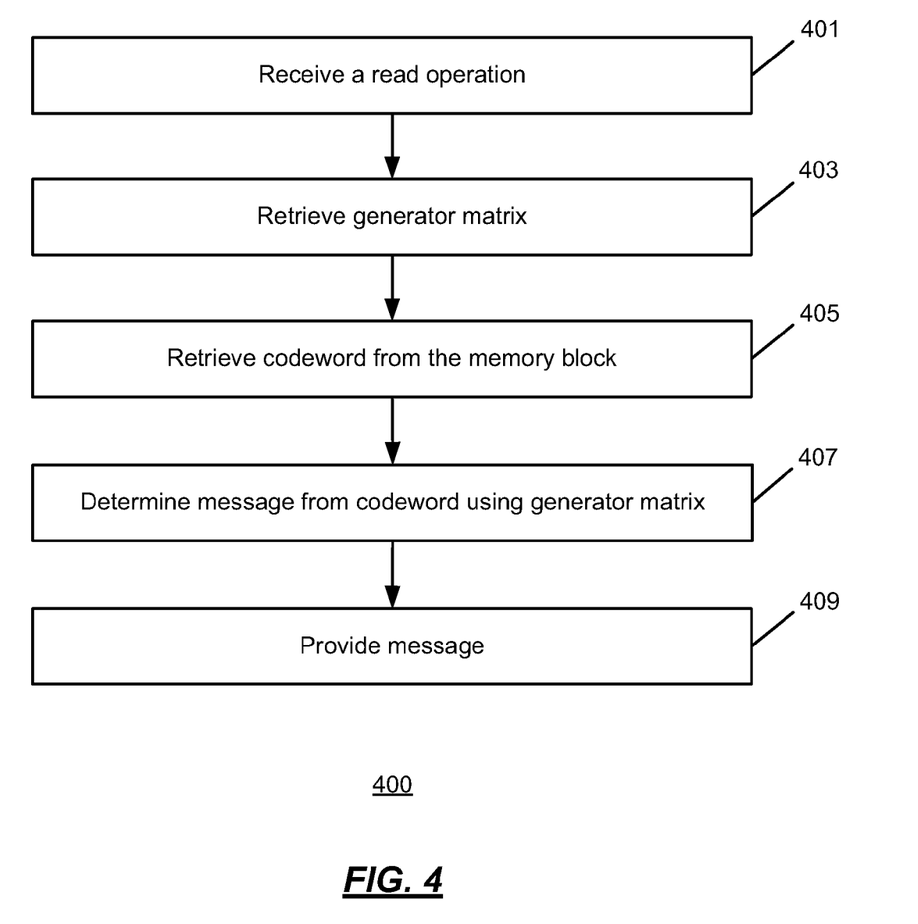
FIG. 4 is an operational flow of an implementation of a method for determining a message from a codeword associated with a read operation.

FIG. 4 is an operational flow of an implementation of a method 400 for determining a message from a codeword associated with a read operation. The method 400 may be implemented by the message generator 230 of the memory controller 106, for example.

A read operation is received at 401. The read operation 250 may be received by the memory controller 106 from an operating system. The read operation 250 may include an identifier of a memory block 105, such as an address.

A generator matrix is retrieved at 403. The generator matrix 120 may be retrieved by the message generator 230 of the memory controller 106. In some implementations, the generator matrix 120 may be an 4×8 matrix. Other matrix sizes may be used.

A codeword is retrieved from the memory block at 405. The codeword may be retrieved by the message generator 230 of the memory controller 106 from the memory blocks 105. The codeword may be retrieved from the memory block 105 identified by the read operation 250.

A message is determined from the codeword using the generator matrix at 407. The message may be determined by the message generator 230 by multiplying the transpose of the codeword by the generator matrix 120.

The message is provided at 409. The message may be provided by the memory controller 106 to the operating system in response to the read operation 250.

Figure 5:
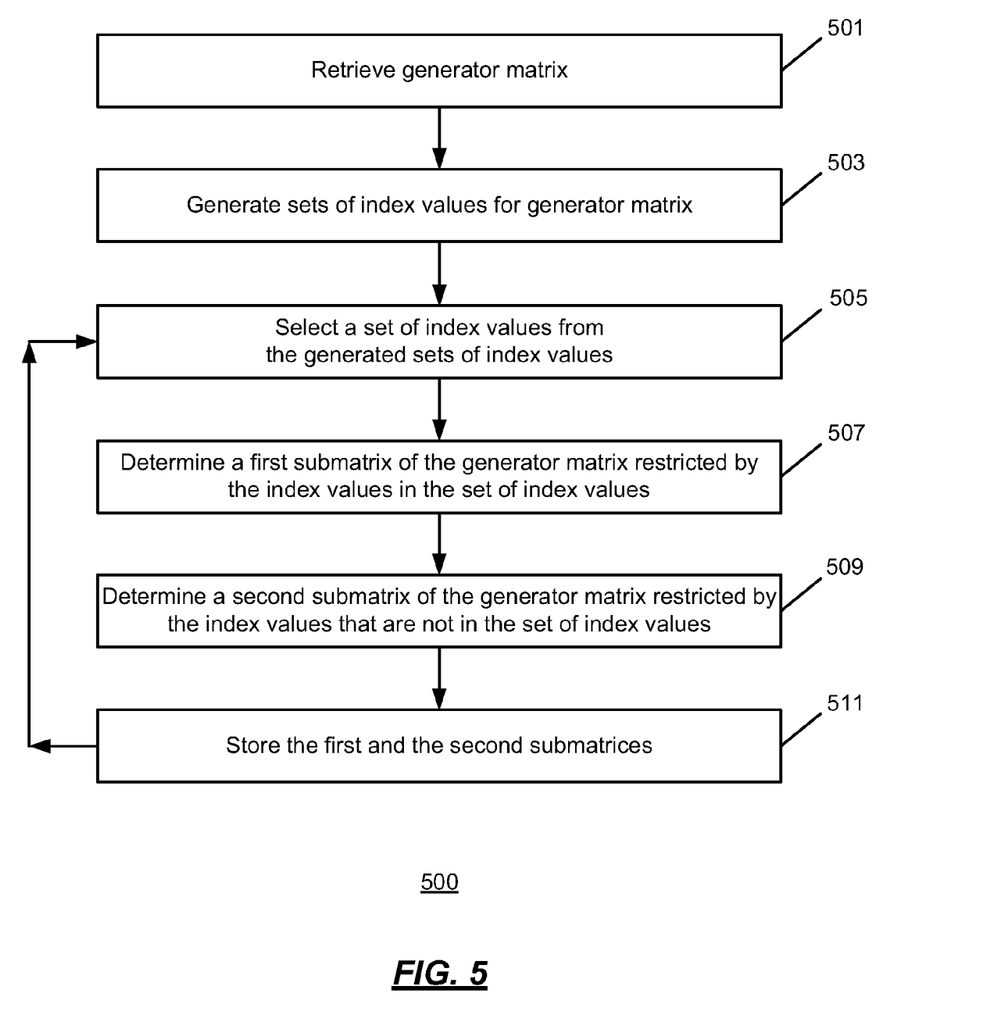
FIG. 5 is an operational flow of an implementation of a method for determining submatrices based on a generator matrix.

FIG. 5 is an operational flow of an implementation of a method 500 for determining submatrices based on a generator matrix 120. The generated submatrices may be stored and later used by the codeword generator 220 of the memory controller 106 to generate one or more codewords from messages received in write operations 260. The method 500 may be implemented by the codeword generator 220 of the memory controller 106, for example.

A generator matrix is retrieved at 501. The generator matrix 120, or G, may be retrieved by the codeword generator 220 of the memory controller 106. The generator matrix 120 may be 4×8 matrix, and each column of the generator matrix 120 may correspond to an index value of a memory block 105. The index values of the memory block 105 may each correspond to a bit of the memory block 105. The index values 1-4 may correspond to bits of the memory block that are primary bits, and the index values 5-8 may correspond to bits of the memory block that are spare bits.

Sets of index values are generated for the generator matrix at 503. The sets of index values may be generated by the codeword generator 220 of the memory controller 106. Each set of index values may have four index values and may represent bits of a hypothetical memory block 105 that are not stuck. As described previously, in an implementation, the memory controller 106 may read codewords from memory blocks 105 having up to three stuck bits. The codeword generator 220 may generate a set of index values corresponding to each possible arrangement of four non-stuck bits. Thus, for example, the codeword generator 220 may generate 8 choose 4 sets of index values.

A set of index values from the generated sets of index values is selected at 505. The set of index values J may be selected by the codeword generator 220 of the memory controller 106.

A first submatrix of the generator matrix restricted by the index values in the set of index values is determined at 507. The first submatrix may be determined by the codeword generator 220 of the memory controller 106. The first submatrix $G|_J$ may be determined from the generator matrix 120 using the columns of the generator matrix that correspond to the index values of the selected set of index values J.

Additionally, in some implementations, the codeword generator 220 may use the generated first submatrix of the generator matrix to generate the inverse of the first submatrix, or M.

A second submatrix of the generator matrix restricted by the index values that are not in the set of index values is determined at 509. The second submatrix may be determined by the codeword generator 220 of the memory controller 106. The second submatrix $G|_{[n]\setminus J}$ may be determined from the generator matrix 120 using the columns of the generator matrix that do not correspond to the index values of the selected set of index values J.

The first and second submatrices are stored at 511. The first and second submatrices may be stored by the codeword generator 220 of the memory controller 106 in the matrix storage 211. In some implementations, the inverse of the first submatrix, M, may be stored in the matrix storage 211, in addition to, or instead of the first submatrix.

After storing the first and second submatrices for the selected set of index values, the method 500 may continue at 505 where a different set of index values may be selected. As may be appreciated, by predetermining one or more of $G|_{[n]\setminus J}$, $G|_J$, and M for possible sets of index values J, the speed of codeword calculations by the codeword generator 220 may be greatly increased.

Figure 6:
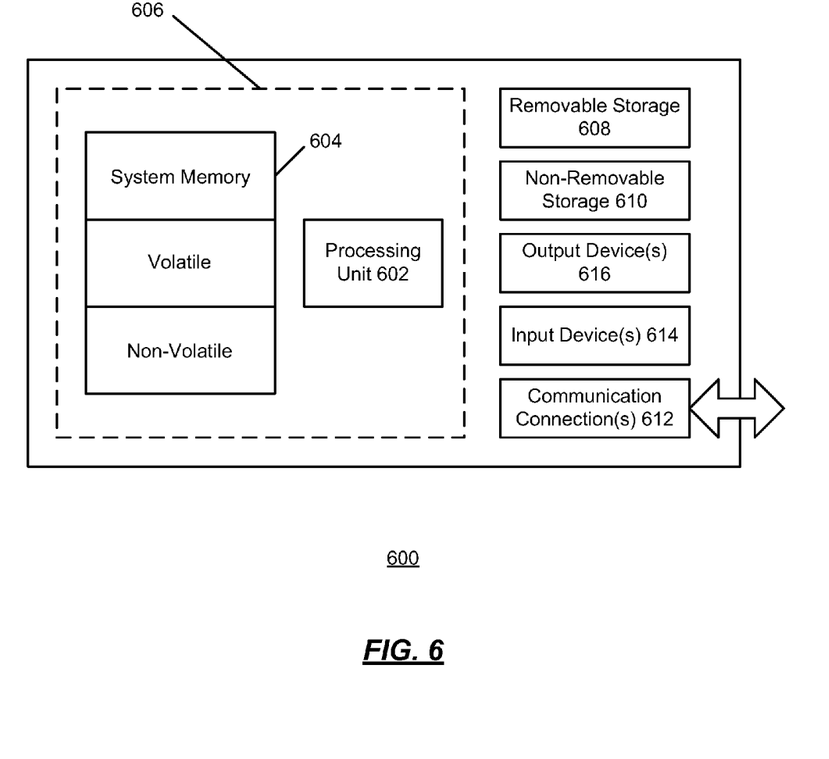
FIG. 6 is a block diagram of a computing system environment according to an implementation of the provided system.

FIG. 6 shows an exemplary computing environment in which example embodiments and aspects may be implemented. The computing system environment is only one example of a suitable computing environment and is not intended to suggest any limitation as to the scope of use or functionality.

Numerous other general purpose or special purpose computing system environments or configurations may be used. Examples of well known computing systems, environments, and/or configurations that may be suitable for use include, but are not limited to, personal computers, server computers, handheld or laptop devices, multiprocessor systems, microprocessor-based systems, network PCs, minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 6, an exemplary system for implementing aspects described herein includes a computing device, such as computing system 600. In its most basic configuration, computing system 600 typically includes at least one processing unit 602 and memory 604. Depending on the exact configuration and type of computing device, memory 604 may be volatile (such as random access memory (RAM)), non-volatile (such as read-only memory (ROM), flash memory, etc.), or some combination of the two. This most basic configuration is illustrated in FIG. 6 by dashed line 606.

Computing system 600 may have additional features/functionality. For example, computing system 600 may include additional storage (removable and/or non-removable) including, but not limited to, magnetic or optical disks or tape. Such additional storage is illustrated in FIG. 6 by removable storage 608 and non-removable storage 610.

Computing system 600 typically includes a variety of computer readable media. Computer readable media can be any available media that can be accessed by computing system 600 and includes both volatile and non-volatile media, removable and non-removable media.

Computer storage media include volatile and non-volatile, and removable and non-removable media implemented in any method or technology for storage of information such as computer readable instructions, data structures, program modules or other data. Memory 604, removable storage 608, and non-removable storage 610 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing system 600. Any such computer storage media may be part of computing system 600.

Computing system 600 may contain communication connection(s) 612 that allow the device to communicate with other devices. Computing system 600 may also have input device(s) 614 such as a keyboard, mouse, pen, voice input device, touch input device, etc. Output device(s) 616 such as a display, speakers, printer, etc. may also be included. All these devices are well known in the art and need not be discussed at length here.

It should be understood that the various techniques described herein may be implemented in connection with hardware or software or, where appropriate, with a combination of both. Thus, the methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computer, the machine becomes an apparatus for practicing the presently disclosed subject matter.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method comprising:
   receiving a write operation by a memory controller, wherein the write operation comprises an identifier of a memory block in a memory device and a message, wherein the memory block comprises a plurality of bits and each bit of the plurality of bits has an associated index value;
   determining zero or more bits of the memory block that are stuck bits by the memory controller;
   retrieving a generator matrix associated with the memory device by the memory controller, wherein the generator matrix comprises a plurality of columns and each column has an associated index value;
   selecting a set of index values from the generator matrix based on the index values associated with the zero or more stuck bits by the memory controller;
   determining a codeword from the message based on the selected set of index values from the generator matrix by the memory controller; and
   storing the determined codeword at the memory block by the memory controller.

2. The method of claim 1, further comprising:
   receiving a read operation, wherein the read operation comprises the identifier of the memory block;
   retrieving an inverse of the generator matrix;
   retrieving the codeword from the memory block;
   determining the message based on the codeword and the generator matrix; and
   providing the message.

3. The method of claim 1, where selecting a set of index values from the generator matrix based on the index values associated with the zero or more stuck bits comprises:
   selecting index values from the generator matrix that are not index values associated with the zero or more stuck bits.

4. The method of claim 3, wherein the bits of the memory block further comprise primary bits and spare bits, and selecting index values from the generator matrix that are not index values associated with the zero or more stuck bits further comprises selecting index values that are associated with spare bits.

5. The method of claim 3, wherein selecting index values from the generator matrix that are not index values associated with the zero or more stuck bits further comprises selecting index values such that a matrix based on the selected index values has a determinant that is non-zero.

6. The method of claim 1, wherein the set of index values comprises four index values.

7. The method of claim 1, wherein determining the codeword from the message based on the selected set of index values from the generator matrix comprises:
   determining a first submatrix of the generator matrix restricted by the index values in the set of index values;
   determining a second submatrix of the generator matrix restricted by the index values that are not in the set of index values; and
   determining the codeword from the message based on the first and the second submatrices.

8. The method of claim 7, wherein the first and second submatrices are predetermined.

9. The method of claim 8, wherein the first and second submatrices are predetermined in advance of a shipment date associated with the memory controller.

10. A method comprising:
    receiving a write operation by a memory controller, wherein the write operation is associated with a message and a memory block, and further wherein the memory block includes a plurality of bits and each bit has an index value;
    receiving identifiers of zero or more stuck bits of the plurality of bits of the memory block by the memory controller;
    selecting a set of index values from a generator matrix associated with the memory controller based on the index values associated with the zero or more stuck bits by the memory controller;
    retrieving a matrix using the selected set of index values by the memory controller, wherein the retrieved matrix is an inverse of a submatrix of the generator matrix restricted by the index values in the set of index values;
    determining a codeword from the message based on the retrieved matrix by the memory controller; and
    storing the determined codeword at the memory block by the memory controller.

11. The method of claim 10, wherein the matrix is retrieved from a ROM or a cache.

12. The method of claim 10, further comprising:
    receiving a read operation, wherein the read operation comprises the identifier of the memory block;

retrieving an inverse of the generator matrix;
retrieving the codeword from the memory block;
determining the message based on the codeword and the generator matrix; and
providing the message.

13. The method of claim 10, where selecting a set of index values from the generator matrix based on the index values associated with the zero or more stuck bits comprises:
selecting index values from the generator matrix that are not index values associated with the zero or more stuck bits.

14. The method of claim 13, wherein the bits of the memory block further comprise primary bits and spare bits, and selecting index values from the generator matrix that are not index values associated with the zero or more stuck bits further comprises selecting index values that are associated with spare bits.

15. The method of claim 13, wherein the submatrix has a non-zero determinant.

16. A system comprising:
a memory device comprising a memory controller and a plurality of memory blocks; and
a codeword generator adapted to:
receive a generator matrix;
receive a number of stuck bits, wherein each memory block comprises a plurality of bits and each bit has an associated index value;
determine a plurality of sets of index values based on the number of stuck bits; and
for each set of index values:
determine a first submatrix of the generator matrix restricted by the index values in the set of index values;
determine a second submatrix of the generator matrix restricted by the index values that are not in the set of index values; and
store the second submatrix and the inverse of the first submatrix for the set of index values.

17. The system of claim 16, wherein the codeword generator is further adapted to:
receive a write operation, wherein the write operation is associated with a message and a memory block of the plurality of memory blocks;
receive identifiers of one or more stuck bits of the plurality of bits of the memory block;
select a set of index values from the generator matrix based on the index values associated with the one or more stuck bits;
retrieve the stored second submatrix and the inverse of the first submatrix corresponding to the selected set of index values;
determine a codeword from the message based on the stored second submatrix and the inverse of the first submatrix corresponding to the selected set of index values; and
store the determined codeword at the memory block associated with the write operation.

18. The system of claim 17, wherein the codeword generator is further adapted to:
receive a read operation, wherein the read operation comprises the identifier of the memory block associated with the write operation;
retrieve an inverse of the generator matrix;
retrieve the codeword from the identified memory block;
determine the message based on the codeword and the generator matrix; and
provide the message.

19. The system of claim 16, wherein the second submatrix and the inverse of the first submatrix for the set of index values are stored in a ROM or a cache.

20. The system of claim 16, wherein the system further comprises a stuck bit determiner adapted to:
determine the number of stuck bits for a memory block using an address of the memory block and an error location vector;
determine one or more new stuck bits for the memory block; and
update the error location vector for the memory block based on the determined new stuck bits.

* * * * *